(12) United States Patent
Bellaar et al.

(10) Patent No.: US 6,208,025 B1
(45) Date of Patent: *Mar. 27, 2001

(54) MICROELECTRONIC COMPONENT WITH RIGID INTERPOSER (75) Inventors: Pieter H. Bellaar, Baambrugge (NL); Thomas H. Distefano, Monte Sereno, CA (US); Joseph Fjelstad, Sunnyvale, CA (US); Christopher M. Pickett, Dublin, CA (US); John W. Smith, Palo Alto, CA (US)

(73) Assignee: Tessera, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/413,410

(22) Filed: Oct. 6, 1999

Related U.S. Application Data (62) Division of application No. 08/978,082, filed on Nov. 25, 1997.

(51) Int. Cl.[7] .............................. H01L 23/48; H01L 23/06
(52) U.S. Cl. ........................ 257/696; 257/693; 257/778; 257/703; 257/688
(58) Field of Search ..................................... 257/696, 693, 257/778, 703, 669, 737, 738, 688, 698, 678

(56) References Cited

U.S. PATENT DOCUMENTS

| | | | |
|---|---|---|---|
| 3,303,393 | 2/1967 | Hymes | 257/738 |
| 3,952,404 | 4/1976 | Matunami | 29/589 |
| 4,893,172 | 1/1990 | Matsumoto et al. | 257/669 |
| 5,067,007 | 11/1991 | Kanji et al. | 257/696 |
| 5,148,265 | 9/1992 | Khandros et al. | 257/773 |
| 5,148,266 | 9/1992 | Khandros et al. | 257/773 |
| 5,152,695 | 10/1992 | Grabbe et al. | 439/71 |
| 5,173,055 | 12/1992 | Grabbe | 439/66 |
| 5,433,822 | 7/1995 | Mimura et al. | 257/737 |
| 5,518,964 | 5/1996 | DiStefano et al. | 438/113 |
| 5,659,952 | 8/1997 | Kovac et al. | 257/668 |
| 5,763,939 | 6/1998 | Yamashita | 257/668 |
| 5,763,941 | 6/1998 | Fjelstad | 257/669 |
| 5,772,451 | * 6/1998 | Dozier et al. | 439/70 |
| 6,002,168 | * 12/1999 | Bellaar et al. | 257/696 |

* cited by examiner

Primary Examiner—Eddie C. Lee
Assistant Examiner—Jhihan B Clark
(74) Attorney, Agent, or Firm—Lerner, David, Littenberg, Krumholz & Mentlik, LLP (57) ABSTRACT A microelectronic component for mounting a rigid substrate, such as a hybrid circuit to a rigid support substrate, such as a printed circuit board. The microelectronic component includes a rigid interposer which may have a chip mounted on its first surface; a pattern of contacts on the rigid interposer; a flexible interposer overlying the second surface of the rigid interposer; a pattern of terminals on the flexible interposer; flexible leads; and solder coated copper balls mounted on the flexible interposer. The microelectronic component may have a socket assembly mounted on the first surface of the rigid interposer. The microelectronic component may be mounted on a rigid support substrate.

32 Claims, 1 Drawing Sheet

MICROELECTRONIC COMPONENT WITH RIGID INTERPOSER

This application is a divisional application of copending application Ser. No. 08/978,082 filed on Nov. 25, 1997.

BACKGROUND OF THE INVENTION

1. Field of the Invention

The present invention relates to the art of electronic packaging, and more specifically to components useful for mounting and/or testing semiconductor chips and related electronic components. The present invention also relates to semiconductor chip assemblies and electronic devices incorporating such components.

2. Description of the Related Art

Modern electronic devices utilize semiconductor components, commonly referred to as "integrated circuits" which incorporate numerous electronic elements. These chips are mounted on substrates that physically support the chips and electrically interconnect each chip with other elements of the circuit. The substrate may be part of a discrete chip package, such as a single chip module or a multi-chip module, or may be a circuit board. The chip module or circuit board is typically incorporated into a large circuit. An interconnection between the chip and the chip module is commonly referred to as a "first level" assembly or chip interconnection. An interconnection between the chip module and a printed circuit board or card is commonly referred to as a "second level" interconnection. In "chip on board" packaging, the chip is mounted directly on the printed circuit board. This type is interconnection has been referred to as a "1½ level" interconnection.

One relatively common packaging scheme is called a "hybrid circuit". A hybrid circuit typically contains a semiconductor chip that has been mounted and electrically interconnected to a circuit that has been formed on a thin layer of a rigid ceramic material. The method used to electrically interconnected the chip to the circuit is generally any of the methods that are known for use in first level bonding, such as wire bonding, tab bonding and flip chip bonding. In some cases it is desirable to mount and electrically interconnect the hybrid circuit to a printed circuit board. Solder is typically used to form the interconnection. It is difficult, however, to rework a hybrid circuit that has been soldered to a printed circuit board. In order to rework the assembly, the hybrid circuit must be removed from the printed circuit board. When the hybrid circuit is separated from the printed circuit board, part of the solder mass is removed from the contacts on the hybrid circuit. Non-uniform partial solder masses remain on the hybrid circuit contacts, the printed circuit board or both. When the hybrid circuit is resoldered to the printed circuit board, the non-uniform partial solder masses can cause short circuits and alignment problems.

Another problem associated with the assembly process is testing. In a typical assembly process, each hybrid circuit is tested before it is soldered to a printed circuit board. Testing involves clamping the hybrid circuit to a socket to engage the solder balls of the hybrid circuit with the test contacts of the test assembly. When the solder balls are engaged with the test contacts, the solder tends to creep and to deform, especially if the hybrid circuit is equipped with high-lead solder. The testing process, like the rework process, can lead to short circuit and alignment problems. To overcome these problems, it is desirable to use solid core solder balls to interconnect the ceramic substrate to a printed circuit board.

In U.S. Pat. No. 3,303,393, which issued on Feb. 7, 1967, Hymes et al. disclose a semiconductor chip assembly with flip-chip connections which incorporates copper core solder balls. One solid core solder ball is provided between each contact on the chip and each contact pad on the substrate. Although these connections work well for small devices, with larger devices, the rigid connections provided by the solid core solder balls tend to crack at the soldered junctions between the balls and the opposing surfaces. Warpage or distortion of the chip or substrate, furthermore, make it difficult to engage all of the solid core solder balls between the chip and substrate simultaneously, or to engage all of the solid core solder balls between the chip and a test fixture. Although it is desirable to use solid core solder balls to interconnect a hybrid circuit to a printed circuit board, such an interconnection would be subject to similar problems.

The electrical power that is dissipated when a microelectronic device is in operation tends to heat up that device. When the device is no longer in operation, it tends to cool down. Over a period of time, the device tends to undergo a number of heating up and cooling down cycles as the device is repeatedly turned on and off. These cycles, which cause an associated expansion and contraction of the device, are commonly referred to as "thermal cycling".

A device in which a hybrid circuit is bonded to a printed circuit board using solid core solder balls would be subject to substantial strain, caused by thermal cycling, during operation of the device. Electrical power dissipated within the hybrid circuit during operation would tend to heat up the hybrid circuit and, to a lesser extent, the printed circuit board. The temperature of the hybrid circuit, therefore, and, to a lesser extent, the printed circuit board would rise each time the device is turned on and fall each time the device is turned off. Since the hybrid circuit and the printed circuit board are normally constructed from different materials having different coefficients of thermal expansion, the hybrid circuit and printed circuit board would normally expand and contract by different amounts. This is commonly referred to as a "thermal mismatch". The thermal mismatch causes the electrical contacts on the hybrid circuit to move relative to the electrical contact pads on the printed circuit board as the temperature of the hybrid circuit and printed circuit board change. The relative movement would deform the electrical interconnections between the hybrid circuit and the printed circuit board and place them under mechanical stress. Since these stresses would be applied repeatedly with repeated operation of the device, they would cause breakage of the electrical interconnections. Thermal cycling stresses may occur even where the hybrid circuit and printed circuit board are formed from like materials having similar coefficients of thermal expansion. This is because the temperature of the hybrid circuit may increase more rapidly than the temperature of the printed circuit board when power is first applied to the hybrid circuit. Unfortunately, solid core solder balls are neither flexible nor strong enough to withstand the strain generated by differential rates of thermal expansion.

Commonly assigned U.S. Pat. Nos. 5,148,265; 5,148,266; 5,518,; and 5,659,952; and patent application Ser. No. 08/365,747, filed on Dec. 29, 1994, the specifications of which are incorporated by reference herein, provide substantial solutions to the problems of thermal stresses and component testing. Nonetheless, still further improvement is desirable.

SUMMARY OF THE INVENTION

One aspect of the present invention provides a flexible chip carrier. The flexible chip carrier of this aspect of the present invention includes a rigid interposer having first and second surfaces. The rigid interposer is preferably adapted to mount and electrically connect a semiconductor chip onto the first surface of the rigid interposer. An interconnection between the rigid interposer and a semiconductor chip is a "first level" interconnection. The rigid interposer may be adapted to interconnect a semiconductor chip using any of the known methods of creating "first level" interconnections. Some conventional "first level" interconnection methods include wire bonding, tape-automated bonding and flip-chip bonding. The second surface contains a plurality of contacts disposed in a pattern. The area encompassed by the contacts is defined as a "contact pattern area". The rigid interposer is preferably a thin, sheet-like layer material. The rigid interposer may be composed of any rigid dielectric material. Preferred rigid dielectric materials include ceramic materials, such as alumina, beryllia, silicon carbide, aluminum nitride, forsterite, mullite, and glass-ceramics; composite materials, such as polyester/fiberglass, polyimide/fiberglass, and epoxy/fiberglass; and silicon. More preferred rigid dielectric materials are the ceramic materials listed above. The preferred ceramic material is alumina. On preferred embodiments, the rigid interposer contains an electrical circuit. Although the coefficient of thermal expansion, hereinafter "CTE", of the rigid interposer is generally greater than the CTE of a semiconductor chip and generally less than the CTE of an epoxy-polyimide printed circuit board, the CTE of the rigid interposer may be roughly equal to the CTE of the semiconductor chip. This is because other sub-components of the present invention, specifically the flexible interposer and/or the optional compliant layer can compensation for the CTE mismatch between chip and the rigid interposer and the CTE mismatch between the rigid interposer and the flexible interposer.

The flexible chip carrier also includes a flexible interposer that overlies the second surface of the rigid interposer. The flexible interposer has a top surface that faces toward the second surface of the rigid interposer, and a bottom surface that does not. The flexible interposer preferably is a thin, flexible sheet of a polymeric material such as polyimide, a fluoropolymer, a thermoplastic polymer or an elastomer. In preferred embodiments, the flexible interposer contains an electrical circuit. The flexible interposer may have one or more apertures, extending from the top surface of the flexible interposer to the bottom surface.

A plurality of electrically conductive terminals is disposed on the flexible interposer in a pattern on at least one surface selected from the group consisting of the top surface and the bottom surface. In preferred embodiments, either all of the terminals disposed on the top surface or all of the terminals are disposed on the bottom surface of the flexible interposer. At least some of the terminals, and preferably most or all of the terminals, are disposed within the area of the flexible interposer overlying the contact pattern area on the rigid interposer. Generally, each terminal is associated with one contact on the rigid interposer.

The flexible chip carrier also includes a plurality of electrically conductive leads connecting at least some of the contacts on the rigid interposer with at least some of the terminals on the flexible interposer. Each lead has a contact end connected to the associated contact on the rigid interposer and a terminal end connected to the associated terminal on the flexible interposer. The leads and the flexible interposer are constructed and arranged so that the contacts ends of the leads are moveable relative to the terminals at least to the extent required to compensate for differential thermal expansion between the components. The interconnection between the contacts on the rigid interposer and the terminals on the flexible interposer is a second "first level" interconnection. The leads are preferably flexible so that the terminals are moveable with respect to the contacts to accommodate movement caused by differential thermal expansion.

The flexible interposer is flexible to facilitate movement of the contact ends of the leads relative to the terminals and thus to contribute to the ability of the chip carrier to withstand thermal cycling. Each flexible lead may extend through an aperture in the flexible interposer. The flexible leads may be formed integrally with the terminals on the flexible interposer, or else may be separately formed fine wires. Preferably, the leads are curved to provide increased flexibility. The leads may be generally S-shaped. Each lead may be formed from a ribbon of conductive materials having oppositely-directed major surfaces, the ribbon being curved in directions normal to its major surfaces to form a curved configuration of the lead In a preferred embodiment, the lead is S-shaped.

Some preferred arrangements of leads connecting the contacts to the terminals include a "fan-in", "fan-out", "fan-in/fan-out", and area array. In a "fan-in" arrangement, the contacts on the rigid interposer are typically disposed on the periphery of the rigid interposer. The terminals are generally disposed inside the region that overlies the region bounded by the contacts on the rigid interposer. The leads connecting the terminals to the associated contacts fan inwardly. In a "fan-out" arrangement, the contacts on the rigid interposer are again generally disposed on the periphery of the rigid interposer, and the terminals on the flexible interposer are generally disposed in a region that is outside the region that overlies the region bounded by the contacts. The leads connecting the terminals to the associated contacts fan outwardly. In a "fan-in/fan-out" arrangement, some terminals on the flexible interposer are disposed inside the region bounded by the contacts and some are disposed outside the region. Some leads, therefore, fan-in and some fan-out. The rigid interposer contacts typically are disposed in single rows and columns on the second surface and the leads are interdigitated. By the term "interdigitated", it is meant that that fan-in and fan-out leads are interspersed with one another. The preferred interdigitated fan-in/fan-out arrangement is where each lead that is adjacent to a fan-in lead is a fan-out lead and each lead that is adjacent to a fan-out lead is a fan-in lead. In an "area array" arrangement, the contacts on the rigid interposer may be disposed on the periphery of the rigid interposer or may be disposed in a so called area array, i.e., a grid like pattern covering all or a substantial portion of the bottom surface of the rigid interposer. For the leads to be in an area array arrangement, however, the terminals on the flexible interposer must be disposed in area array.

The flexible chip carrier further includes a plurality of joining units, each -including a solid core which is preferably spherical. Each joining unit is disposed on the bottom surface of the flexible interposer, is electrically interconnected to one terminal, and extends downwardly from such terminal. If any terminals are disposed on the bottom surface of the flexible interposer, one of said joining units is preferably disposed directly on each of such terminals. The solid cores are preferably electrically conductive. Preferably, the solid cores are made from copper or nickel.

The flexible chip carrier also includes a unit bonding material. The unit bonding material extends between the terminal and the solid core. Preferably, the unit bonding material is standard lead/tin solder and is provided as a part of the joining unit, as a coating extending over the solid core. The unit bonding material may be used to bond the flexible chip carrier to a printed circuit board or another support substrate.

The flexible chip carrier may also include a compliant layer covering the flexible leads in whole or in part. The compliant layer comprises a dielectric material having a low modulus of elasticity, such as an elastomeric material. Preferred elastomeric materials include silicones, flexiblized epoxies, and thermoplastics. Silicone elastomers are particularly preferred. The dielectric material may be provided in the form of a layer, with holes in the layer aligned with the terminals on the flexible interposer. In preferred embodiments, the compliant layer is formed in at least a two step process. The first step involves dispensing a controlled amount of a thixotropic or non-slumping silicone elastomer on a portion, but not all, of the bottom surface of the rigid interposer and/or a portion, but not all, of the first surface of the flexible interposer, to create a compliant spacer. The compliant spacer controls the separation between the rigid interposer and the flexible interposer. The second step involves dispensing a second silicone elastomer over the thixotropic or non-slumping silicone elastomer. Compliant spacers and their use in microelectronic assemblies is more fully described in commonly assigned, U.S. Pat. No. 5,659,952, the specification of which is hereby incorporated by reference.

One aspect of the present invention provides a semiconductor chip assembly. The semiconductor chip assembly of the present invention includes the flexible chip carrier described above and at least one semiconductor chip that has been connected to the first surface of the rigid interposer of the flexible chip carrier. The semiconductor chip assembly of the present invention may contain a plurality of semiconductor chips.

If the semiconductor chip assembly contains a plurality of chips, each chip is mounted on and electrically interconnected to the rigid interposer of the flexible chip carrier. Such assemblies may be referred to as multichip modules. Such a multichip module may, for example, comprise a monolithic microwave integrated circuit and a high frequency digital integrated circuit on one rigid interposer that is part of a flexible chip carrier. If both of these high frequency elements are on one rigid interposer, the high frequency elements of the circuit can be isolated from the lower frequency elements. In another embodiment, an integrated circuit in the form of a central processing unit, sometimes referred to as a "cpu", and one or more memory chips may be mounted on a rigid interposer of the present flexible chip carrier to form a semiconductor chip assembly of the present invention. Such an assembly would also be a multichip module.

Preferred methods of connecting the one or more semiconductor chips to the flexible chip carrier include wirebonding, flip chip bonding and tab bonding, with wire bonding and flip chip bonding being more preferred. If the semiconductor chip is to be wire bonded, the rigid interposer should have as plurality of electrically conductive pads disposed in a ring-like pattern.

The chip is secured to the first surface of the rigid interposer at the center of the ring-like pattern, so that the contact pads on the rigid interposer surround the chip. The chip is mounted on the first surface of the rigid interposer. The chip is mounted on the rigid interposer in a face-up disposition, with the back surface of the chip confronting the first surface of the rigid interposer, and with the front surface of the chip facing upwardly, away from the rigid interposer so that the electrical contacts on the front surface of the chip are exposed. Fine wires are connected between the electrical contacts on the front surface of the chip and the contact pads on the first surface of the rigid interposer. These wires extend outwardly from the chip to the surrounding contact pads on the first surface of the rigid interposer.

If the semiconductor chip is to be connected to the rigid interposer using flip chip technology, the electrical contacts on the front surface of the chip are provided with bumps of solder. The first surface of the rigid interposer should include a plurality of contact pads arranged in an array corresponding to the array of electrical contacts on the chip. The chip, with the solder bumps, is inverted so that its front surface faces towards the first surface of the rigid interposer, with each electrical contact and solder bump on the chip being positioned on the appropriate contact pad on the first surface of the rigid interposer. The assembly is then heated so as to liquefy the solder and, upon resolidification of the solder, bond each contact on the chip to the confronting contact pad on the first surface of the rigid interposer.

The semiconductor chip assembly of the present invention has at least two "first level" interconnections in the flexible chip carrier. The first "first level" interconnection is the interconnection between the semiconductor chip and the rigid interposer and second "first level" interconnection is the interconnection between the rigid interposer and the flexible interposer.

Another aspect of the present invention provides a test assembly for semiconductor chips. Current semiconductor chip manufacturing techniques do not result in 100% yields, some chips, therefore, will be defective. Often, the defect can not be detected until the chip is operated under power in a test fixture or in an actual assembly. A single bad chip can make a larger assembly, which may include other chips or other valuable components, worthless, or can require painstaking procedures to extricate the bad chip from the assembly. The chips and the mounting components used in a semiconductor chip assembly should, therefor, permit testing of the chips and replacement of the chips before the chips are fused to a substrate.

Semiconductor chips can be tested in the test assembly of the present invention. The test assembly of this aspect of the present invention includes the flexible chip carrier as described above. The test assembly further includes a sheet socket assembly or connector. Preferred sheet socket assemblies and connectors are those described in commonly assigned U.S. Pat. No. 5,615,824; U.S. Pat. No. 5,632,631; U.S. patent application Ser. No. 08/254,991, filed on Jun. 7, 1994; and U.S. patent application 08/862,151, filed on May 22, 1997, the specifications of which are incorporated by reference herein.

In preferred embodiments, the sheet socket component or connector includes a planar or sheet like dielectric body having first and second major surfaces and also having a plurality of holes open to the first major surface. The second major surface faces toward the first surface of the rigid interposer of the flexible chip carrier. The holes are disposed in an array corresponding to an array of bumped leads on a semiconductor chip or microelectronic device which is to be tested. The sheet socket assembly further includes an array of resilient contacts secured to the first major surface of the dielectric body in registration with the holes so that each such resilient contact extends over one hole. Each resilient contact is adapted such that it can resiliently engage a bumped lead that has been inserted into the associated hole.

The sheet socket assembly also includes a plurality of socket terminals electrically connected to these resilient contacts. Typically, the socket terminals are disposed on the second major surface of the dielectric body in an array corresponding to the array of contact pads on the first surface of the rigid interposer. The socket terminals are electrically connected to the associated resilient contacts. Preferably, each socket terminal is electrically connected to an associated resilient contact by an electrically conductive via, such as a blind via or a through hole via. The sheet socket assembly is mounted and electrically interconnected to the flexible chip carrier by bonding the socket terminals to the associated contact pad on the rigid interposer.

Another aspect of the present invention provides a semiconductor chip assembly comprising the test assembly described above and a semiconductor chip having solder bumps which have engaged and are in physical and electrical contact with the resilient contacts of the test assembly. In preferred embodiments of the semiconductor chip assembly of this aspect of present invention, the semiconductor chip is soldered to the test assembly.

If the semiconductor chip assembly of this aspect of the invention contains more than one chip, the assembly can be described as a multichip module assembly. Each chip of the multichip module can be individually plugged into the test socket assembly of the present invention and the system can be tested. If the system works properly, each of the chips can be soldered in permanently. In the alternative, a module containing at least two chips can be plugged into the test socket assembly and tested. If the system works properly, each of the chips can be soldered in permanently.

The semiconductor chip assembly of the present invention may be incorporated into a larger assembly to form an electronic device. Another aspect of the present invention, therefore, provides an electronic device. The electronic device includes the semiconductor chip assembly described above and a support substrate having pads. The pads are electrically conductive contact pads and are preferably disposed in a pattern corresponding to the pattern of solid core joining units, wherein each pad is associated with a solid core joining unit. The semiconductor chip assembly is positioned on the support substrate such that the bottom surface of the flexible interposer faces toward the support substrate and, preferably, such that the solid core joining units on the bottom surface of the flexible interposer are aligned with the pads on the support substrate. Generally, each solid core joining unit is physically and electrically interconnected to an associated pad on the support substrate.

The flexible chip carrier of the present invention of the present invention may be incorporated into a larger assembly to form an electronic component. Another aspect of the present invention, therefore, provides an electronic component. The electronic component of the present aspect of the invention includes the flexible chip carrier described above and a support substrate having pads. The pads are electrically conductive contacts pads and are preferably disposed in a pattern corresponding to the pattern of solid core joining units, wherein each pad is associated with a solid core joining unit. The flexible chip carrier is positioned on the support substrate such that the bottom surface of the flexible interposer faces toward the support substrate and, preferably, such that the solid core joining units on the bottom surface of the flexible interposer are aligned with the pads on the support substrate. Generally, each solid core joining unit is physically and electrically interconnected to an associated pad on the support substrate. A semiconductor chip may be bonded to the electronic component to form an electronic device. Preferred bonding methods include wire bonding, flip chip bonding and tab bonding with wire bonding and flip chip bonding being particularly preferred.

The objects, features and advantages of the present invention will be more readily apparent from the detailed description of the preferred embodiments set forth below, taken in conjunction with the accompanying drawings.

DETAILED DESCRIPTION OF THE PREFERRED EMBODIMENTS

Figure 1:
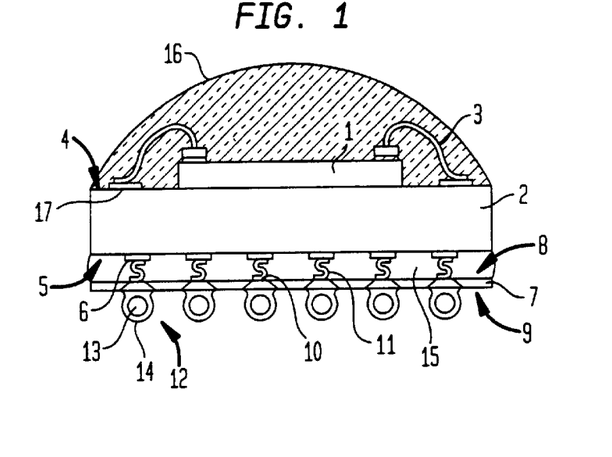
FIG. 1 is a diagrammatic sectional view depicting one embodiment of the semiconductor chip assembly of the present invention.

A semiconductor chip assembly in accordance with one embodiment of the present invention is shown in FIG. 1 and includes a semiconductor chip 1. The semiconductor chip 1 is wire bonded to rigid interposer 2 with wirebonds 3 and contact pads 17. This is a "first level" interconnection. The rigid interposer 2 has a first surface 4, a second surface 5 and a plurality of electrical contacts 6 on such second surface 5. The rigid interposer may be made from any rigid materials and may contain one or more microelectronic components and a circuit (not shown). The assembly must include electrical interconnections between electrical contacts 6 and respective wirebonds 3. When the rigid interposer 2 includes a circuit, the interconnection is accomplished by interconnecting both the electrical contacts 6 and the wire bonds 3 to respective sites on the circuitry.

The assembly further includes a flexible interposer 7 having a top surface 8, a bottom surface 9, apertures (not shown), and terminals 10. The terminals 10 are disposed on the top surface 8 of the flexible interposer 7. The top surface 8 faces the second surface 5 of the rigid interposer 2. The bottom surface 9 faces away from the second surface 5 of the rigid interposer 2. Contacts 6 are electrically interconnected to terminals 10 with flexible electrical connections 11. This is the second "first level interconnection of this assembly. In this embodiment electrical connections 11 are flexible conductive leads. Contacts 6, terminals 10 and leads 11 are disposed in respective area arrays, such as is shown in commonly assigned U.S. Pat. No. 5,518,964, which is incorporated herein by reference.

A plurality of joining units 12 are disposed on the terminals 10. Each joining unit 12 includes a spherical solid core 13 having a diameter which is less than the pitch or distance between adjacent terminals. Preferably, each core is between about 0.25 mm and about 0.5 mm in diameter. All of the cores used in a particular assembly should be of substantially the same diameter. Although the cores may be formed from a dielectric materials, the cores are preferably formed from an electrically conductive material, more preferably from a metal such as copper, silver, nickel and alloys or combinations thereof. Copper and copper alloys are particularly preferred. Each joining unit further includes a layer of a unit bonding material or solder 14 such as an alloy of lead and tin covering the core. Solder 14 is adapted to bond to the metal of the core and to metals used in terminals 10. Solder 14 has a melting temperature substantially lower than the solidus temperature of cores 13. As used in this disclosure, the term "solidus temperature" refers to the temperature which the core can withstand while remaining in the solid state, without substantial melting or decomposition.

The assembly further includes a compliant layer 15 formed from an elastomer, gel, adhesive or other compliant material and disposed between the second surface 5 of the rigid interposer 2 and the top surface 8 of the flexible interposer 7 surrounding flexible leads 11.

The assembly further includes a protective coating 16 covering all or a portion of semiconductor chip 1 and leads 11. The protective coating is preferably formed from an elastomer or resin. A particularly preferred protective coating is an epoxy glob top material.

Figure 2:
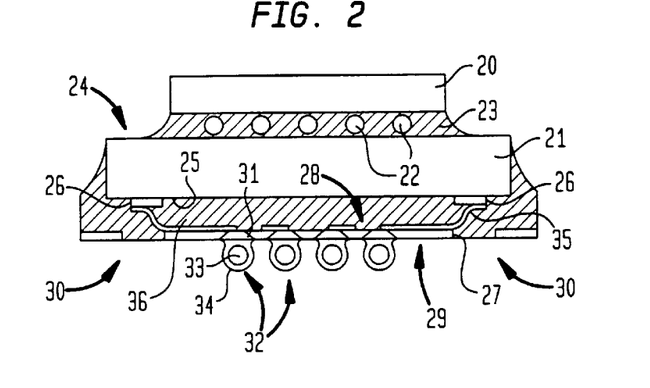
FIG. 2 is a diagrammatic sectional view depicting another embodiment of the semiconductor chip assembly of the present invention.

A semiconductor chip assembly in accordance with another embodiment of the present invention is shown in FIG. 2 and includes a semiconductor chip 20. Chip 20 is flip chip bonded to the rigid interposer 21 using solder balls 22. This is a "first level" interconnection. Chip 22 is underfilled with adhesive 23. Adhesive 23 is preferably a rigid epoxy. The rigid interposer 21 has a first surface 24, a second surface 25 and a plurality of electrical contacts 26 on second surface 25. The assembly must include electrical interconnections between solder balls 22 and contacts 26.

The assembly further includes a flexible interposer 27 having a top surface 28, a bottom surface 29, apertures 30, and conductive vias 31.

The assembly further includes a plurality of joining units 32 disposed on the bottom surface 29. Each joining unit 32 includes a spherical solid core 33 having a diameter which is less than the pitch or distance between adjacent terminals. Preferably, each core is between about 0.25 mm and about 0.5 mm in diameter. All of the cores used in a particular assembly should be of substantially the same diameter. The cores may be formed from an electrically conductive material, preferably a metal such as copper, silver, nickel and alloys or combinations thereof. Copper and copper alloys are particularly preferred. Each joining unit 32 further includes a layer of a unit bonding material 34 extending over the surface of the solid core 33. The preferred unit bonding material is solder. Each joining unit 32 is connected to a via 31.

The assembly further includes electrical connections 35 which connect each contact 26 with an associated joining unit 32 through an associated via 31. This is the second "first level interconnection of this assembly. In this embodiment electrical connections 35 are extended flexible leads. The extended portions of flexible leads 35 together with the vias 31 define terminals.

The assembly further includes a compliant layer 36 formed from an elastomer, gel, adhesive or other compliant material and disposed between the second surface 25 of the rigid interposer 21 and the top surface 28 of the flexible interposer 27, and surrounding flexible leads 35.

Figure 3:
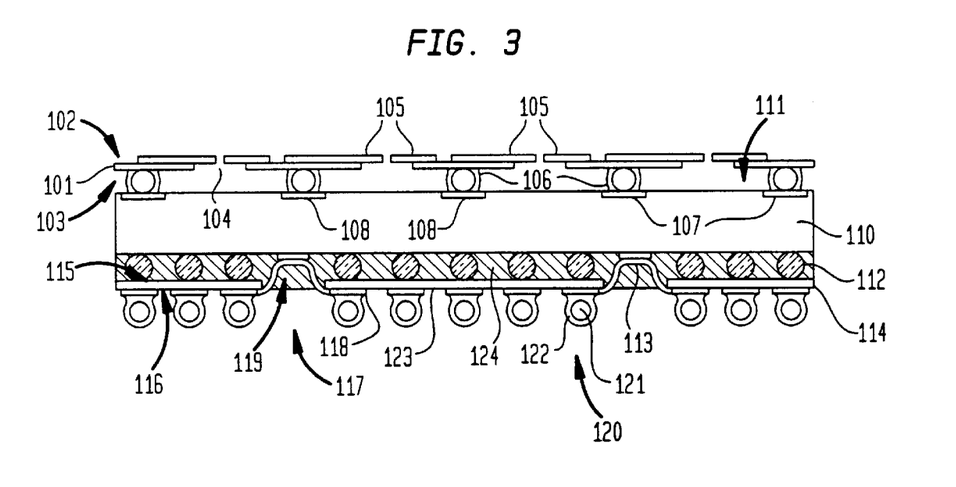
FIG. 3 is a diagrammatic sectional view depicting one embodiment of the test assembly of the present invention.

A test assembly in accordance with one embodiment of the present invention is shown in FIG. 3 and includes a rigid interposer 110 having a first surface 111, a second surface 112 and a plurality of electrical contacts 113 on such second surface 112. The rigid interposer may be made from any rigid materials and may contain one or more microelectronic components and a circuit (not shown).

The assembly further includes a flexible interposer 114 having a top surface 115, a bottom surface 116, apertures, 117, and terminals 118. The terminals 118 are disposed on the bottom surface 116 of the flexible interposer 114. The top surface 115 faces the second surface 112 of the rigid interposer 110. The bottom surface 116 faces away from the second surface 112 of the rigid interposer 110. Contacts 113 are electrically interconnected to terminals 118 with electrically connections 119. Electrical connections 119 are flexible leads and are arranged in a fan-in/fan-out arrangement.

A plurality of joining units 120 are disposed on the terminals 118. Each joining unit 120 includes a spherical solid core 121 having a diameter which is less than the pitch or distance between adjacent terminals. Preferably, each solid core 121 is between about 0.25 mm and about 0.5 mm in diameter. All of the solid cores 121 used in a particular assembly should be of substantially the same diameter. The cores may be formed from an electrically conductive material, preferably a metal such as copper, silver, nickel and alloys or combinations thereof Copper and copper alloys are particularly preferred. Each joining unit further includes a layer of a unit bonding material or solder 122 such as an alloy of lead and tin covering the solid core 121. Solder 122 is adapted to bond to the metal of the solid core 121 and to metals used in terminals 118. Solder 122 has a melting temperature substantially lower than the solidus temperature of the solid core 121. In preferred embodiments, solder 122 is a lead tin solder.

The test assembly further includes complaint spacers 123. The compliant spaces are preferably formed from an elastomer. The assembly further includes a compliant layer 124 formed from an elastomer, gel, adhesive or other compliant material and disposed between the second surface 112 of the rigid interposer 110 and the top surface 115 of the flexible interposer 114 surrounding flexible leads 119.

The test assembly further includes a socket assembly comprising a sheet-like dielectric body 101 having a first major surface 102, a second major surface 103 and a plurality of holes 104. The second major surface 103 faces toward first surface 111 of rigid interposer 110. The socket assembly further includes a plurality of resilient contacts 105 secured to first major surface 102. Each resilient contact 105 extends over one hole 104. The socket assembly also includes a plurality of socket terminals 106 mounted on the second major surface 103 of the sheet-like dielectric body 101. Each socket terminal 106 is electrically connected an associated resilient contact 105 by a blind via (not shown). Socket terminals are generally conductive standoffs which in this embodiment make use of solid core solder balls. Each socket terminal 106 has a solid spherical core 108. The diameter of each solid spherical core 108 is approximately the same. Each socket terminal 106 acts as spacer unit to insure a minimum separation between the sheet-like dielectric body 101 and the rigid interposer 110. The socket terminals 106 are disposed in an array which corresponds to the array of contact pads 107 on the first surface 111 of the rigid interposer 10. Socket terminals 106 are soldered to contact pads 107.

One or more microelectronic elements may be incorporated into the test socket assembly of the present invention. Such microelectronic elements include single semiconductor chips, a plurality of individual semiconductor chips, a plurality of interconnected semiconductor chips or a wafer of un-diced semiconductor chips. Other microelectronic elements, such as resistors, capacitors, inductors, etc., may also be connected to the test socket assembly. The plurality of interconnected chips may be in the form of a multichip module.

The microelectronic element may be temporarily plugged into the test socket assembly in order to test the microelectronic element. If the element is working properly, then the microelectronic element can be permanently incorporated into the test socket assembly to form a microelectronic device. Such elements will typically include a bottom side with a plurality of solder balls. The element is plugged into the test socket assembly such that one or more of the solder balls of the element engages the resilient contacts of the test socket assembly. The element is tested to insure that it is working properly. The element may then be removed and later incorporated into a separate microelectronic device or the element may be permanently attached to the test socket assembly to form a microelectronic device. One method of permanently incorporating the element is by heating the solder balls to liquefy the solder and then resolidifying the solder.

Furthermore, one or more microelectronic elements may be incorporated into the aforementioned assembly of the present invention to form an electrically interconnected circuit between such elements. For example, the rigid interposer may include conductive traces which interconnect contact pads in different regions of the rigid interposer with one another. The circuitry interconnecting the contact pads may also include traces on the flexible interposer connected to the contact pads through additional contacts on the bottom surface of the rigid interposer and flexible leads attached to these additional leads.

As these and other variation and combinations of the features discussed above can be utilized without departing from the present invention as defined in the claims, the foregoing description of the preferred embodiments should be taken as illustrating, rather than limiting, the invention as claimed.

What is claimed is:

1. A socket assembly for a microelectronic component, comprising:
   a first interposer having a first and a second surface and a plurality of electrical contacts on said first surface of said first interposer;
   a sheet-like socket assembly having a first and a second surface and a plurality of apertures therethrough, said socket assembly further having a plurality of resilient socket contacts each extending into an associated aperture and socket terminals each being electrically connected to one of the socket contact, wherein said second surface of said socket assembly is juxtaposed with said first surface of said first interposer and said socket terminals are connected to said contacts on said first interposer such that there is a gap between the first surface of the first interposer and the second surface of the socket assembly; and
   a second interposer having a top surface and a bottom surface and terminals exposed to said bottom surface, said top surface being juxtaposed with and connected to said second surface of said first interposer such that at least some of the contacts on the first interposer are electrically connected to terminals on the second interposer, said second interposer further being more flexible than said first interposer.

2. The socket assembly as claimed in claim 1, wherein at least some of the contacts on the first interposer are exposed to the second surface of the first interposer.

3. The socket assembly as claimed in claim 1, wherein the first interposer further includes a plurality of contacts disposed on the second surface of the first interposer.

4. The socket assembly as claimed in claim 1, wherein said socket terminals and said contacts on said first surface of said first interposer are connected by electrically conductive spacers.

5. The socket assembly as claimed in claim 1, wherein said first interposer further includes one or more microelectronic components and a circuit interconnecting said components.

6. The socket assembly as claimed in claim 1, wherein said socket assembly further includes one or more microelectronic elements thereon or connected thereto.

7. The socket assembly as claimed in claim 1, further comprising conductive traces in or on one or both of said first interposer and said second interposer electrically interconnecting elements of the socket assembly with one another.

8. The socket assembly as claimed in claim 3, further comprising a plurality of joining units disposed on and attached to said second interposer terminals.

9. The socket assembly as claimed in claim 8, wherein at least some of the contacts on the first interposer are electrically connected to terminals on the second interposer with flexible leads.

10. The socket assembly as claimed in claim 8, wherein each joining unit is comprised of solid spherical core electrically attached to said first interposer contacts and said socket terminals by a unit bonding material.

11. The socket assembly as claimed in claim 9, wherein the second interposer terminals is moveable relative to said first interposer so as to compensate for thermal expansion differences between said first interposer and second interposer.

12. The socket assembly as claimed in claim 1, further comprising a compliant layer disposed between said first interposer and said second interposer and surrounding said flexible leads.

13. The socket assembly as claimed in claim 12, wherein said compliant layer consists of an elastomer or gel layer.

14. The socket assembly as claimed in claim 4, wherein each said spacer is comprised of a solid spherical core electrically attached to said first interposer contacts and said socket terminals by a unit bonding material.

15. The socket assembly as claimed in claim 6, wherein said microelectronic elements include semiconductor chips having solder ball contacts connected to said socket contacts.

16. The socket assembly as claimed in claim 6, wherein said microelectronic elements include one or more of resistors, capacitors, and inductors.

17. The socket assembly as claimed in claim 15, wherein said chips are electrically interconnected to form a multichip module.

18. A microelectronic component, comprising:
   a first interposer having a plurality of contacts, said first interposer being adapted for mounting a semiconductor chip thereon and electrically connecting a semiconductor chip thereto;
   a second interposer overlying the first interposer, said second interposer having a top surface facing the first interposer and a bottom surface opposite the top surface, said second interposer being more flexible than said first interposer;
   a plurality of terminals exposed to the bottom surface of said second interposer; and
   a plurality of electrical connections connecting said terminals on said second interposer to said contacts on said first interposer, said terminals being moveable relative to said contacts so as to compensate for thermal expansion of said first interposer.

19. The microelectronic component of claim 18, further comprising a plurality of joining units exposed on the bottom surface of the second interposer and electrically connected to the plurality of terminals.

20. The microelectronic component of claim 18, wherein the first interposer comprises a rigid dielectric material selected from the group consisting of alumina, beryllia, silicon carbide, aluminum nitride, forsterite, mullite, glass-ceramics, polyester/fiberglass, polyimide/fiberglass, and epoxy/fiberglass.

21. The microelectronic component of claim 18, wherein the second interposer comprises a flexible sheet of a polymeric material.

22. The microelectronic component of claim 18, wherein the second interposer has at least one aperture extending from the top surface to the bottom surface.

23. The microelectronic component of claim 18, wherein each of said electrical connections includes a flexible conductive lead.

24. The microelectronic component of claim 18, wherein all of said terminals are disposed on the top surface of said second interposer.

25. The microelectronic component of claim 19, wherein each of the joining units includes a solid core.

26. The microelectronic component of claim 25, wherein each of the joining units includes a solder coated copper ball.

27. The microelectronic component of claim 20, wherein the rigid dielectric material is selected from the group consisting of alumina, beryllia, silicon carbide, and aluminum nitride.

28. The microelectronic component of claim 27, wherein the rigid dielectric material is alumina.

29. The microelectronic component of claim 21, wherein the polymeric material is selected from the group consisting of polyimide, a fluoropolymer, a thermoplastic polymer or an elastomer.

30. The microelectronic component of claim 29, wherein the polymeric material is polyimide.

31. The microelectronic component of claim 22, wherein at least one of the electrical connections extends through the aperture.

32. The microelectronic component of claim 24, wherein each of said flexible conductive leads is S-shaped.

* * * * *

UNITED STATES PATENT AND TRADEMARK OFFICE
CERTIFICATE OF CORRECTION

PATENT NO.   : 6,208,025 B1
DATED        : March 27, 2001
INVENTOR(S)  : Bellaar et al.

It is certified that error appears in the above-identified patent and that said Letters Patent is hereby corrected as shown below:

<u>Title page,</u>
Inventor section "Distefano" should read -- DiStefano --.

<u>Column 1,</u>
Line 32, "is" should read -- of --.
Line 39, "interconnected" should read -- interconnect --.

<u>Column 2,</u>
Line 10, "make" should read -- makes --.
Line 58, "5,518" should read -- 5,518,964 --.

<u>Column 4,</u>
Line 42, cancel "that" (first occurrence).
Line 49, "grid like" should read -- grid-like --.

<u>Column 5,</u>
Line 24, "is" should read -- are --.
Line 59, "as" should read -- a --.

<u>Column 6,</u>
Line 55, "sheet like" should read -- sheet-like --.

<u>Column 7,</u>
Line 56, "contacts" should read -- contact --.

<u>Column 8,</u>
Line 46, after "level" insert -- " --.
Line 59, "materials" should read -- material --.

<u>Column 9,</u>
Line 47, after "level" insert --" --.

<u>Column 10,</u>
Lines 3 and 4 "electri-cally" should read -- electrical --.
Line 15, after "thereof" insert -- . --.
Line 42, after "connected" insert -- to --.
Line 53, "10" should read -- 110 --.

UNITED STATES PATENT AND TRADEMARK OFFICE
CERTIFICATE OF CORRECTION

PATENT NO. : 6,208,025 B1
DATED : March 27, 2001
INVENTOR(S) : Bellaar et al.

It is certified that error appears in the above-identified patent and that said Letters Patent is hereby corrected as shown below:

Column 11,
Line 43, "contact" should read -- contacts --.

Column 12,
Line 21, after "of" insert -- a --.
Line 25, "terminals" should read -- terminal --.
Line 29, "1" should read -- 11 --.

Column 14,
Line 19, "24" should read -- 23 --.

Signed and Sealed this

Fifteenth Day of January, 2002

Attest:

JAMES E. ROGAN
Director of the United States Patent and Trademark Office

Attesting Officer